United States Patent
Takii

(10) Patent No.: US 9,000,426 B2
(45) Date of Patent: Apr. 7, 2015

(54) ORGANIC LIGHT-EMITTING DISPLAY DEVICE AND METHOD OF MANUFACTURING THE SAME

(71) Applicant: Samsung Display Co., Ltd., Yongin, Gyeonggi-Do (KR)

(72) Inventor: Kenji Takii, Hwaseong-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/961,791

(22) Filed: Aug. 7, 2013

(65) Prior Publication Data

US 2014/0312312 A1    Oct. 23, 2014

(30) Foreign Application Priority Data

Apr. 17, 2013   (KR) .................. 10-2013-0042374

(51) Int. Cl.
| | |
|---|---|
| *H01L 29/08* | (2006.01) |
| *H01L 35/24* | (2006.01) |
| *H01L 51/00* | (2006.01) |
| *H01L 27/32* | (2006.01) |
| *H01L 51/56* | (2006.01) |

(52) U.S. Cl.
CPC ............ *H01L 27/3262* (2013.01); *H01L 51/56* (2013.01)

(58) Field of Classification Search
CPC .......... H01L 51/00; H01L 27/00; H01L 29/00
USPC .......... 257/40, E33.005, E51.022, 88; 438/26
See application file for complete search history.

(56) References Cited

U.S. PATENT DOCUMENTS

2012/0049178 A1*  3/2012  Sugimoto et al. ............... 257/40

FOREIGN PATENT DOCUMENTS

| JP | 2004-349317 A | 12/2004 |
|---|---|---|
| KR | 10-2005-0091981 A | 9/2005 |
| KR | 10-2010-0127538 A | 12/2010 |
| KR | 10-2012-0006810 A | 1/2012 |

\* cited by examiner

*Primary Examiner* — Telly Green
(74) *Attorney, Agent, or Firm* — Knobbe, Martens, Olson & Bear, LLP

(57) ABSTRACT

A method of manufacturing an organic light-emitting display device includes providing a substrate which comprises thin-film transistors (TFTs), and forming a planarization layer over the substrate. The planarization layer comprises a first planarization portion and a plurality of second planarization portions. The method further includes forming a plurality of first electrodes over the planarization layer, forming an organic light-emitting layer over each of the first electrodes, and forming a second electrode over the organic light-emitting layer. The forming of the planarization layer includes forming the first planarization portion which defines a plurality of first openings and forming one of the second planarization portions in each of the first openings.

10 Claims, 14 Drawing Sheets

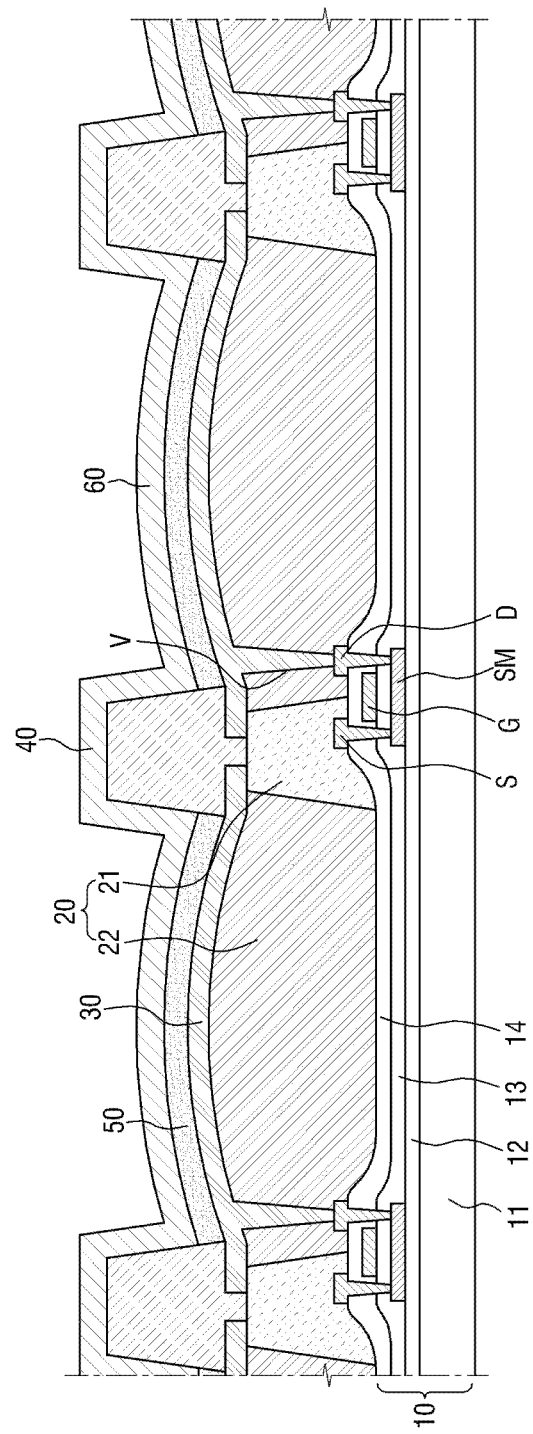

ORGANIC LIGHT-EMITTING DISPLAY DEVICE AND METHOD OF MANUFACTURING THE SAME

This application claims priority from Korean Patent Application No. 10-2013-0042374 filed on Apr. 17, 2013 in the Korean Intellectual Property Office, the disclosure of which is incorporated herein by reference in its entirety.

BACKGROUND

1. Field

The present disclosure relates to an organic light-emitting display device including a planarization layer and a method of manufacturing the organic light-emitting display device.

2. Discussion of the Related Technology

As portable display devices (such as notebook computers, mobile phones and portable media players (PMPs)) as well as display devices for homes (such as TVs and monitors) become lighter and thinner, various flat panel display devices are being widely used. A flat panel display device includes a display panel for displaying images. Flat panel display devices may encompass liquid crystal display devices, organic light-emitting display devices, and electrophoretic display devices according to the type of the display panel.

An organic light-emitting display device may include an organic light-emitting diode (OLED), which includes an anode, a cathode and an organic light-emitting layer disposed between the anode and the cathode and emitting light. The organic light-emitting layer may emit light in response to a signal transmitted to the anode and the cathode. More specifically, the organic light-emitting layer may emit light at a brightness level corresponding to a current flowing therethrough in response to a signal transmitted to the anode and the cathode.

A planarization layer may be disposed under the OLED. The planarization layer may be formed on a thin-film transistor (TFT) and wirings. The OLED is formed on a surface of the planarization layer. The foregoing discussion is to provide background information, and does not constitute an admission of the prior art.

SUMMARY

Aspects of the present invention provide an organic light-emitting display device and a method of manufacturing the same, in which the unevenness of a top surface of a planarization layer can be reduced while the planarization layer is kept thin.

Aspects of the present invention also provide an organic light-emitting display device and a method of manufacturing the same, in which deterioration of display quality can be avoided or minimized while a planarization layer is kept thin.

However, aspects of the present invention are not restricted to the one set forth herein. The above and other aspects of the present invention will become more apparent to one of ordinary skill in the art to which the present invention pertains by referencing the detailed description of the present invention given below.

One aspect of the present invention provides a method of manufacturing an organic light-emitting display device, the method comprising providing a substrate which comprises thin-film transistors (TFTs), forming a planarization layer over the substrate, wherein the planarization comprises a first planarization portion and a plurality of second planarization portions, forming a plurality of first electrodes over the planarization layer, forming an organic light-emitting layer over each of the first electrodes; and forming a second electrode over the organic light-emitting layer, wherein the forming of the planarization layer comprises, forming the first planarization portion which defines a plurality of first openings and forming one of the second planarization portions in each of the first openings.

Another aspect of the present invention provides an organic light-emitting display device comprising a substrate which comprises TFTs, a planarization layer which is disposed over the substrate and comprises a first planarization portion and a plurality of second planarization portions, a plurality of first electrodes disposed over the planarization layer, an organic light-emitting layer disposed over each of the first electrodes and a second electrode disposed over the organic light-emitting layer, wherein the first planarization portion surrounds each of the second planarization portions when viewed in a direction perpendicular to a major surface of the substrate.

BRIEF DESCRIPTION OF THE DRAWINGS

The above and other aspects and features of the present invention will become more apparent by describing in detail exemplary embodiments thereof with reference to the attached drawings, in which:

FIG. 14 is a cross-sectional view of an organic light-emitting display device according to another embodiment of the present invention.

DETAILED DESCRIPTION OF EMBODIMENTS

Figure 1:
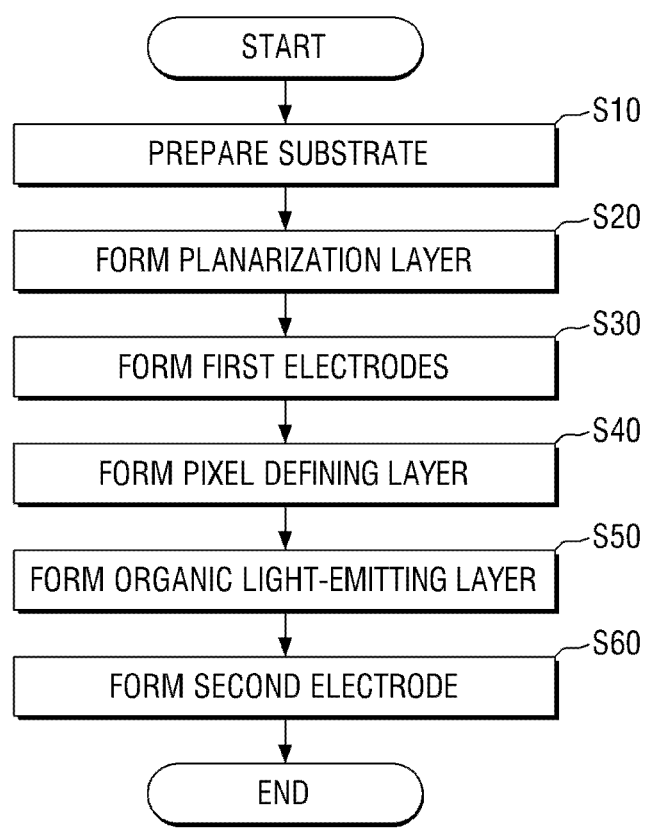
FIG. 1 is a flowchart illustrating a method of manufacturing an organic light-emitting display device according to an embodiment of the present invention.

Advantages and features of the present invention and methods of accomplishing the same may be understood more readily by reference to the following detailed description of embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

Hereinafter, embodiments of the present invention will be described with reference to the attached drawings.

In organic light-emitting diode (OLED) display devices, a planarization layer may provide a smooth or planarized surface. An OLED is formed on the smooth surface of the planarization layer. As display devices become thinner, the planarization layer is required to be thinner. When the planarization layer is thin, a top surface of the planarization layer may become uneven depending on the shapes of TFT's structures and wirings. Such uneven top surfaces of the planarization layer may also make the anode, the organic light-emitting layer and the cathode uneven. This may degrade display quality of the organic light-emitting display devices.

FIG. 1 is a flowchart illustrating a method of manufacturing an organic light-emitting display device according to an embodiment of the present invention. Referring to FIG. 1, the method of manufacturing an organic light-emitting display device may include preparing a substrate (operation S10), forming a planarization layer (operation S20), forming a plurality of first electrodes (operation S30), forming a pixel defining layer (operation S40), forming an organic light-emitting layer (operation S50), and forming a second electrode (operation S60).

Figure 2:
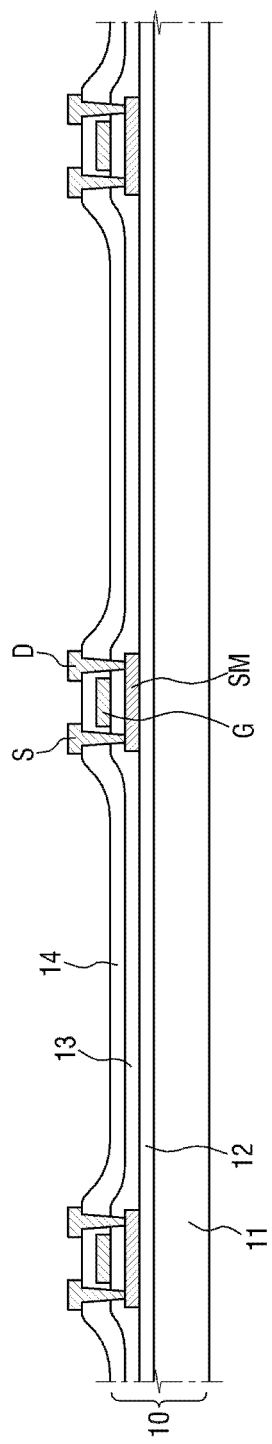
FIG. 2 is a cross-sectional view of an organic light-emitting display device, illustrating an operation of preparing a substrate according to an embodiment of the present invention.

The preparing of the substrate (operation S10) will now be described with reference to FIG. 2. FIG. 2 is a cross-sectional view of an organic light-emitting display device, illustrating an operation of preparing a substrate according to an embodiment of the present invention.

Referring to FIG. 2, a substrate 10 may include a base 11, a buffer layer 12, a gate insulating layer 13, an interlayer insulating film 14, and a plurality of thin-film transistors (TFTs), each including a semiconductor layer SM, a gate electrode G, a source electrode S and a drain electrode D.

The base 11 may be formed of an insulating material. The base 11 may be formed of glass, quartz, ceramic, plastic, etc. The base 11 may be shaped like a flat plate. According to some embodiments, the base 11 may be flexible or deformable and formed of a material that can be easily bent by an external force. The base 11 may support other components disposed on the base 11.

The buffer layer 12 may be disposed on the base 11. The buffer layer 12 may avoid or minimize the penetration of impurity elements and provides a planarized surface over the base 11. The buffer layer 12 may be formed of various materials that can perform these functions. In an example, the buffer layer 12 may be any one of a silicon nitride ($SiN_x$) layer, a silicon oxide ($SiO_2$) layer, and a silicon oxynitride ($SiO_xN_y$) layer. According to some embodiments, the buffer layer 12 may be omitted.

The semiconductor layer SM may be disposed on the buffer layer 12. The semiconductor layer SM may be formed of an amorphous silicon layer or a polycrystalline silicon layer. According to some embodiments, the semiconductor layer SM may be formed of an organic semiconductor material. The semiconductor layer SM may include a channel region which is undoped with impurities and source and drain regions which are disposed at both sides of the channel region and are doped to contact the source and drain electrodes S and D, respectively.

The gate insulating layer 13 may be disposed on the semiconductor layer SM. The gate insulating layer 13 may insulate the gate electrode G from the semiconductor layer SM. The gate insulating layer 13 may be formed of $SiN_x$ or $SiO_2$.

The gate electrode G may be disposed on the gate insulating layer 13. The gate electrode G may be disposed to overlap at least part of the semiconductor layer SM. A voltage applied to the gate electrode G may control the semiconductor layer SM to become conductive or non-conductive. For example, when a relatively high voltage is applied to the gate electrode G, the semiconductor layer SM may become conductive, thereby electrically connecting the drain electrode D and the source electrode S to each other. When a relatively low voltage is applied to the gate electrode G, the semiconductor layer SM may become non-conductive, thereby insulating the drain electrode D and the source electrode S from each other.

The interlayer insulating film 14 may be disposed on the gate electrode G. The interlayer insulating film 14 may cover the gate electrode G to insulate the gate electrode G from the source electrode S and the drain electrode D. The interlayer insulating film 14 may be formed of $SiN_x$ or $SiO_2$.

The source electrode S and the drain electrode D may be disposed on the interlayer insulating film 14. The source electrode S and the drain electrode D may respectively be connected to the semiconductor layer SM by through holes that pass through the interlayer insulating film 14 and the gate insulating layer 13.

The source electrode S, the drain electrode D, the gate electrode G, and the semiconductor layer SM may form a TFT. The TFT may determine whether to deliver a signal, which is transmitted to the source electrode S, to the drain electrode D according to a voltage applied to the gate electrode G.

Figure 3:
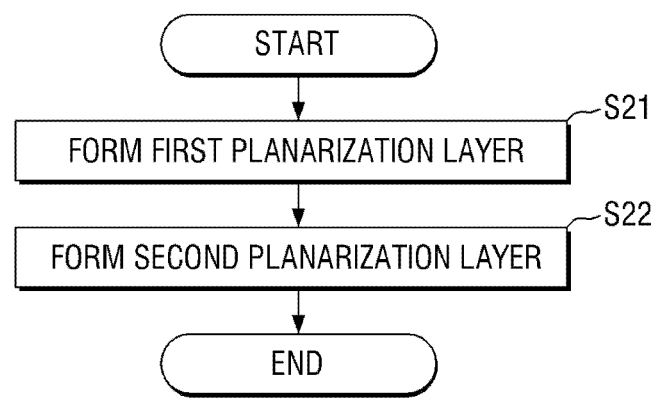
FIG. 3 is a flowchart illustrating an operation of forming a planarization layer according to an embodiment of the present invention.

The forming of the planarization layer (operation S20) will now be described with reference to FIGS. 3 through 8. FIG. 3 is a flowchart illustrating an operation of forming a planarization layer according to an embodiment of the present invention. Referring to FIG. 3, the forming of the planarization layer (operation S20) includes forming a first planarization portion (operation S21) and forming a second planarization portion (operation S22). The forming of the first planarization portion (operation S21) is first described in detail with reference to FIGS. 4 through 6.

Figure 4:
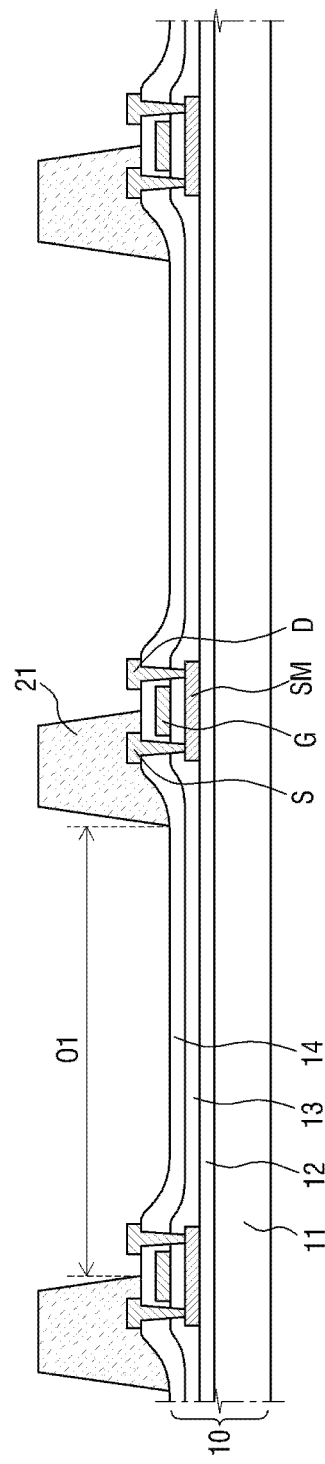
FIG. 4 is a cross-sectional view of the organic light-emitting display device, illustrating an operation of forming a first planarization portion according to an embodiment of the present invention.

FIG. 4 is a cross-sectional view of an unfinished or intermediate product of the organic light-emitting display device, illustrating an operation of forming a first planarization portion according to an embodiment of the present invention. Referring to FIG. 4, a first planarization portion 21 is formed on the substrate 10. The first planarization portion 21 may be formed of one or more materials selected from polyacrylates resin, epoxy resin, phenolic, resin, polyamides resin, polyimides resin, unsaturated polyesters resin, poly phenylenethers resin, poly phenylenesulfides resin, and benzocyclobutene (BCB). A plurality of first openings O1 may be formed in the first planarization portion 21. A top surface of the substrate 10 may be exposed the first openings O1. Each of the first openings O1 may be formed for forming one pixel of the organic light-emitting display device. In embodiments, the first planarization portion 21 has a lattice shape.

Figure 5:
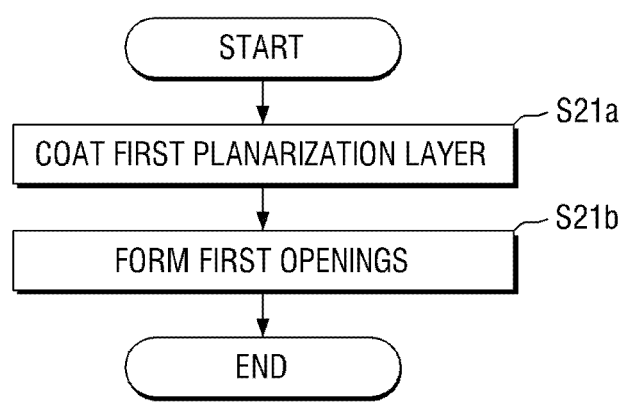
FIG. 5 is a flowchart illustrating the operation of forming the first planarization portion according to an embodiment of the present invention.

FIG. 5 is a flowchart illustrating the operation of forming the first planarization portion according to an embodiment of the present invention. Referring to FIG. 5, the forming of the first planarization portion (operation S21) may include coating a first planarization material (operation S21a) and patterning the coated first planarization material, thereby forming a plurality of first openings (operation S21b).

Figure 6:
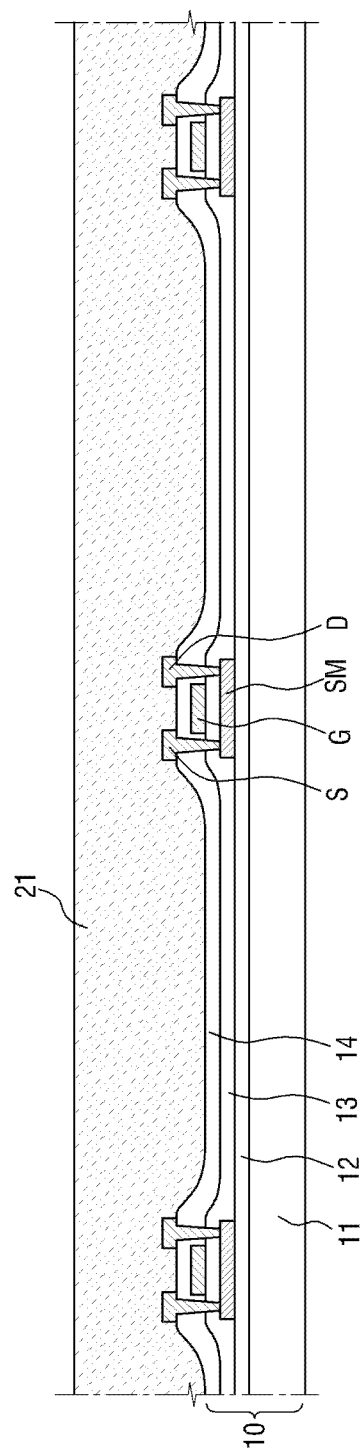
FIG. 6 is a cross-sectional view of the organic light-emitting display device, illustrating an operation of coating a first planarization material according to an embodiment of the present invention.

FIG. 6 is a cross-sectional view of the organic light-emitting display device, illustrating an operation of coating a first planarization material according to an embodiment of the present invention. Referring to FIG. 6, in embodiments, while coating the first planarization material (operation S21a), the first planarization material may be coated throughout the top surface of the substrate 10. The first planarization material may be coated on the substrate 10 by spin coating or slit coating.

Figure 7:
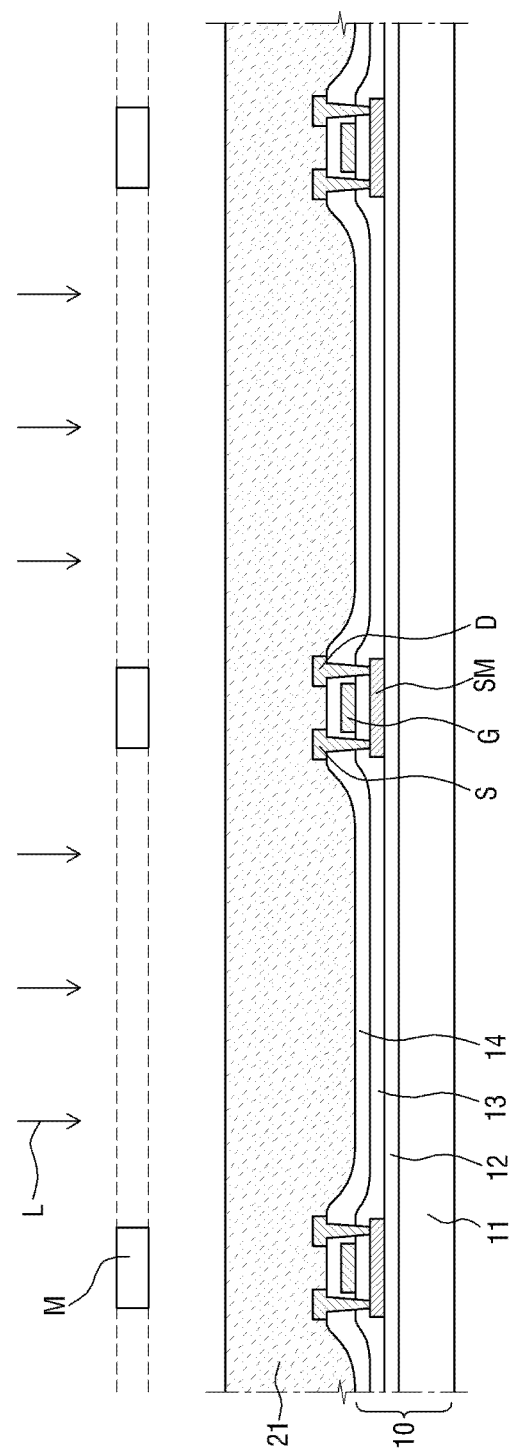
FIG. 7 is a cross-sectional view of the organic light-emitting display device, illustrating an operation of forming a plurality of first openings according to an embodiment of the present invention.

FIG. 7 is a cross-sectional view of the organic light-emitting display device, illustrating an operation of forming a plurality of first openings according to an embodiment of the present invention. Referring to FIG. 7, in the forming of the first openings (operation S21b), the first planarization portion 21 may be selectively removed by exposing the first planarization portion 21 to light by using a mask M. According to some embodiments, the first openings O1 may also be formed by selectively etching the coated first planarization material.

Figure 8:
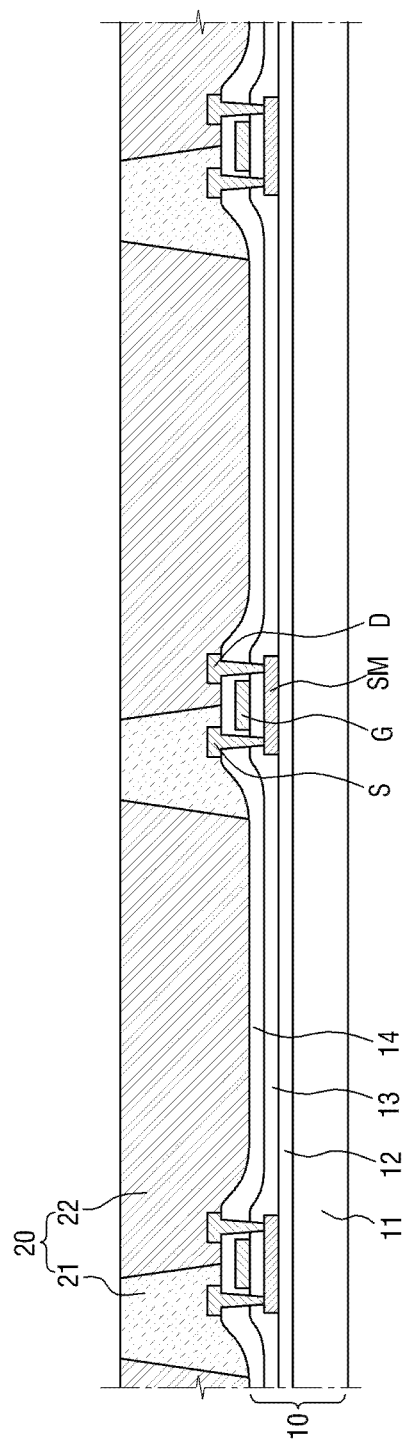
FIG. 8 is a cross-sectional view of the organic light-emitting display device, illustrating an operation of forming a second planarization layer according to an embodiment of the present invention.

The forming of the second planarization portion (operation S22) will now be described with reference to FIG. 8. FIG. 8 is a cross-sectional view of the organic light-emitting display device, illustrating an operation of forming a second planarization portion according to an embodiment of the present invention. Referring to FIG. 8, the second planarization portion 22 may be formed in the first openings O1. The second planarization portion 22 may be formed of one or more materials selected from polyacrylates resin, epoxy resin, phenolic resin, polyamides resin, polyimides resin, unsaturated polyesters resin, poly phenylenethers resin, poly phenylenesulfides resin, and BCB. The second planarization portion 22 may be formed of, but not limited to, the same material as the first planarization portion 21. Alternatively, the second planarization portion 22 may be formed of, but not limited to, a material different from that of the first planarization portion 21. In embodiments, the second planarization portion 22 may be formed by providing one of the foregoing materials into the first openings O1 using an inkjet transfer method. Initially, the material may be injected into the first openings O1 in a fluid state. Then, after a top surface of the material becomes flat, it may harden to form the second planarization portion 22.

In embodiments, referring to FIGS. 4 and 8, the first planarization portion 21 is located to cover a source electrode S, and the second planarization portion 21 is located to cover a drain electrode D.

In accordance with the foregoing embodiment, in which the planarization layer 20 is formed, the first planarization portion 21 may provide the first openings O1, of which corresponds to one of the plurality of pixels, and the second planarization portion 22 may be disposed in the first openings O1. Therefore, a separate second planarization portion 22 may be formed for each pixel. Each second planarization portion 22 is spaced from and separate from other neighboring second planarization portions 22. This configuration allows each of the second planarization portions 22 to form a smooth or planarized surface. Thus, since the flatness of the planarization layer 20 can be managed for each pixel, even if the planarization layer 20 is made thin, the flatness of a top surface of the planarization layer 20 disposed under each pixel can be increased. In addition, since the second planarization portion 22 is formed using an inkjet transfer method, the flatness of the top surface of the planarization layer 20 under each pixel can be improved as compared with a comparative process in which the planarization layer 20 is integrally formed on the whole top surface of the substrate 10 by spin coating or slit coating. The improved flatness of the top surface of the planarization layer 20 enables first electrodes, an organic light-emitting layer and a second electrode to be formed in uniform shapes on the planarization layer. As a result, the display quality of the organic light-emitting display device can be improved.

Figure 9:
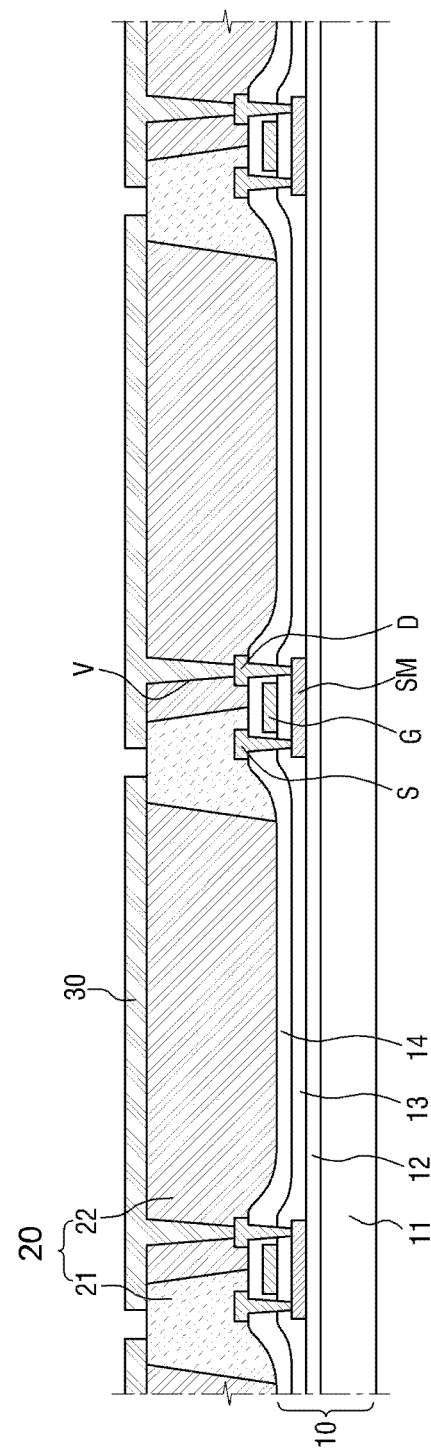
FIG. 9 is a cross-sectional view of the organic light-emitting display device, illustrating an operation of forming a plurality of first electrodes according to an embodiment of the present invention.

The forming of the first electrodes (operation S30) will now be described with reference to FIG. 9. FIG. 9 is a cross-sectional view of the organic light-emitting display device, illustrating an operation of forming a plurality of first electrodes according to an embodiment of the present invention. A plurality of first electrodes 30 which are separated or spaced from each other may be formed on the planarization layer 20. The first electrodes 30 may be formed of a reflective conductive material, a transparent conductive material, or a semi-transparent conductive material. The reflective conductive material may be lithium (Li), calcium (Ca), lithium fluoride/calcium (LiF/Ca), lithium fluoride/aluminum (LiF/Al), aluminum (Al), silver (Ag), magnesium (Mg), or gold (Au). The transparent conductive material may be indium tin oxide (ITO), indium zinc oxide (IZO), zinc oxide (ZnO), or indium oxide ($In_2O_3$). Also, the semi-transparent conductive material may be a co-deposition material containing one or more of Mg and Ag or may be one or more of Mg, Ag, Ca, Li, and Al. In embodiments, each of the first electrodes 30 may be formed to completely cover a top surface of the corresponding second planarization portion 22. A region or gap between two adjacent first electrodes 30 may be disposed on the first planarization portion 21. Each of the first electrodes 30 may be connected to a TFT, more specifically, the drain electrode D of the TFT through a via hole V formed in the planarization layer 20, in particular, the second planarization portion 22.

The method of manufacturing an organic light-emitting display device may further include forming the via hole V for connecting each of the first electrodes 30 to the drain electrode D in the planarization layer 20 before the forming of the first electrodes 30 (operation S30). In FIG. 9, the via hole V is formed in the second planarization portion 22. However, this is merely an example, and the position of the via hole V can vary according to the position of a TFT. In an example, the via hole V may be formed in the first planarization portion 21 or may be formed to pass through the first planarization portion 21 and the second planarization portion 22.

Figure 10:
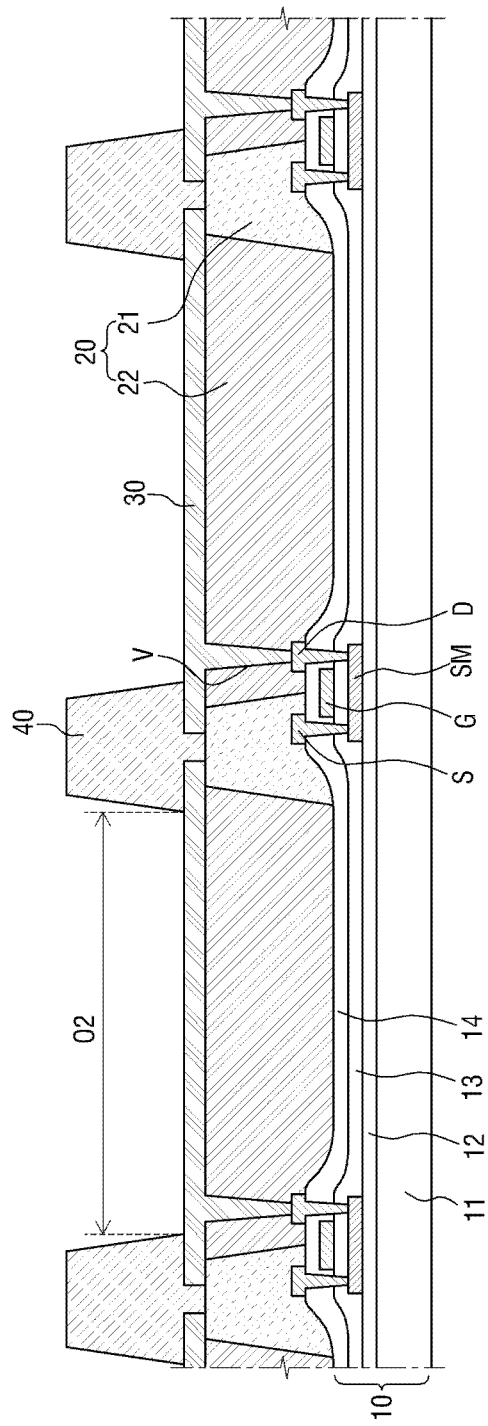
FIG. 10 is a cross-sectional view of the organic light-emitting display device, illustrating an operation of forming a pixel defining layer according to an embodiment of the present invention.

The forming of the pixel defining layer (operation S40) will now be described with reference to FIG. 10. FIG. 10 is a cross-sectional view of the organic light-emitting display device, illustrating an operation of forming a pixel defining layer according to an embodiment of the present invention. Referring to FIG. 10, the pixel defining layer 40 may be formed on the planarization layer 20. The pixel defining layer 40 may be disposed in the region that separates every two adjacent first electrodes 30. The pixel defining layer 40 may be formed to be partially disposed on the first electrodes 30, but the present invention is not limited thereto. The pixel defining layer 40 may define each pixel region formed in the organic light-emitting display device. A plurality of second openings O2 may be formed in the pixel defining layer 40, and a pixel region may be defined in each of the second openings O2.

The second openings O2 formed in the pixel defining layer 40 may expose top surfaces of the first electrodes 40. The second openings O2 may be disposed on the first openings O1 to overlap the first openings O1. The second openings O2 may be narrower than the first openings O1. Because the second openings O2 are narrower than the first openings O1, edge regions of the second planarization portion 22 may be disposed under the pixel defining layer 40. A peripheral region of the second planarization portion 22 may be less flat than a central region thereof due to surface tension and friction of the second planarization portion 22 with the first planarization portion 21 in the process of forming the second planarization portion 22. Because the second openings O2 are narrower than the first openings O1, the relatively less flat edge regions of the second planarization portion 22 may be disposed under the pixel defining layer 40. Thus, the first electrodes 30, an organic light-emitting layer 50, and a second electrode 60 can be formed flat in the second openings O2. As a result, the display quality of the organic light-emitting display device can be improved.

In an OLED device in accordance with embodiments, the first planarization portion 21 surrounds each of the second planarization portions 22 when viewed in a viewing direction perpendicular to a major surface of the substrate. In one embodiment, the major surface is a bottom surface of the substrate. Further, the pixel defining layer 40 disposed over the planarization layer 20 surrounds the organic light-emitting layer 50 when viewed in the viewing direction. In some embodiments, each of the second planarization portions 22 overlaps a corresponding one of the first electrodes 30 and completely covers the organic light-emitting layer 50 formed over the corresponding one of the first electrodes 30 when viewed in the viewing direction.

Figure 11:
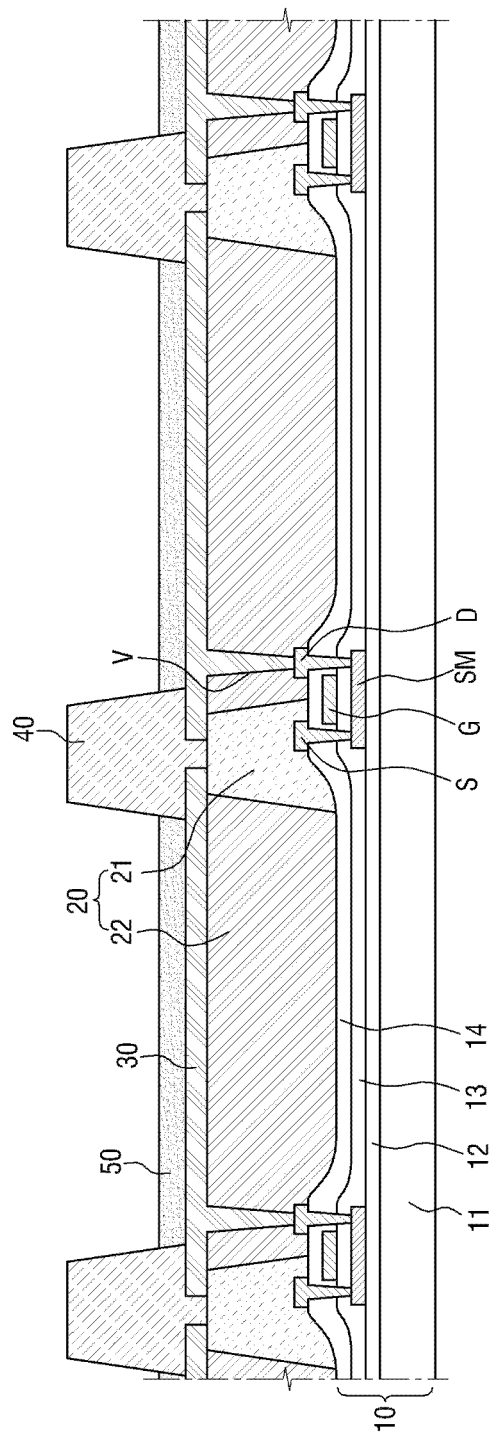
FIG. 11 is a cross-sectional view of the organic light-emitting display device, illustrating an operation of forming an organic light-emitting layer according to an embodiment of the present invention.

The forming of the organic light-emitting layer (operation S50) will now be described with reference to FIG. 11. FIG. 11 is a cross-sectional view of the organic light-emitting display device, illustrating an operation of forming an organic light-emitting layer according to an embodiment of the present invention. The organic light-emitting layer 50 may be formed on each of the first electrodes 30. The organic light-emitting layer 50 may emit light at a brightness level corresponding to a current flowing therethrough. More specifically, holes and electrons provided to the organic light-emitting layer 50 may combine to form excitons. When an energy level of the excitons changes from an excited state to a ground state, light of a color corresponding to the changed energy level may be emitted. The organic light-emitting layer 50 formed in each of the second openings O2 may emit one of red light, blue light and green light. According to some embodiments, the organic light-emitting layer 50 may also emit white light. Although not shown in the drawing, in embodiments, the organic light-emitting layer 50 may emit white light, and the organic light-emitting display device may further include a color filter placed on the path of light emitted from the organic light-emitting layer 50.

Figure 12:
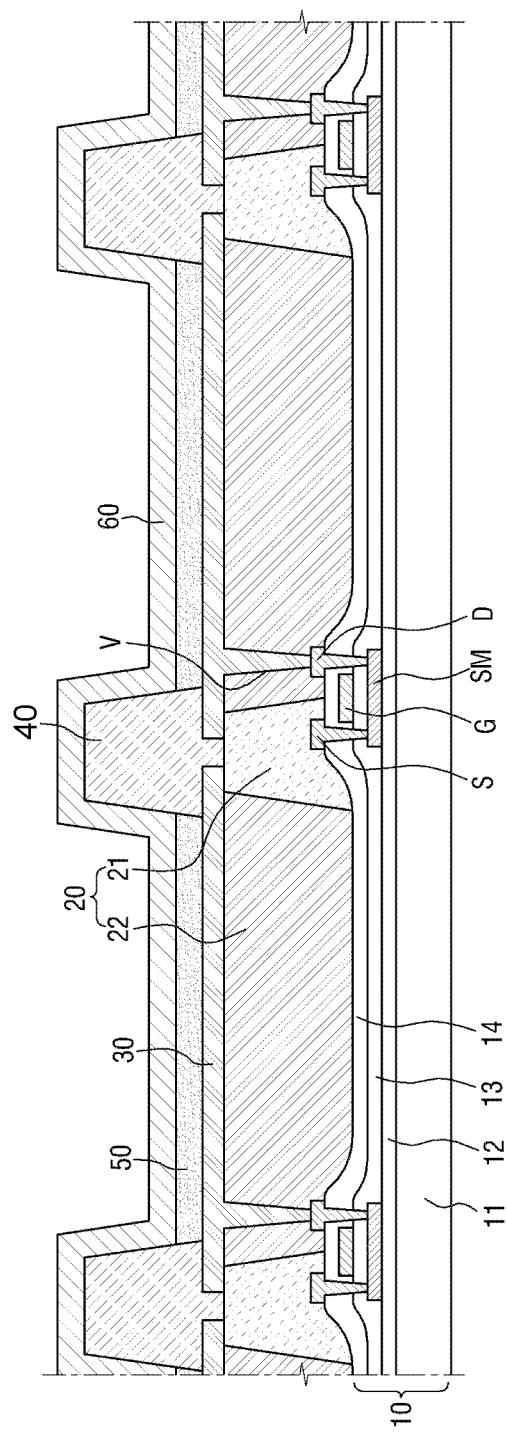
FIG. 12 is a cross-sectional view of the organic light-emitting display device, illustrating an operation of forming a second electrode according to an embodiment of the present invention.

The forming of the second electrode (operation S60) will now be described with reference to FIG. 12. FIG. 12 is a cross-sectional view of the organic light-emitting display device, illustrating an operation of forming a second electrode according to an embodiment of the present invention. A cross-sectional view of the organic light-emitting display device formed using the method of forming an organic light-emitting display device according to the current embodiment may be identical to FIG. 12. In the illustrated embodiment, the second electrode 60 may be formed on the organic light-emitting layer 50. The second electrode 60 may be formed on the whole surface of the organic light-emitting display device including a top surface of the organic light-emitting layer 50 and a top surface of the pixel defining layer 40. However, the present invention is not limited thereto. Although not shown in the drawing, the second electrode 60 may also be formed on each organic light-emitting layer 50 as a plurality of patterns which are separated from each other. The second electrode 60 may be formed of, but not limited to, the same material as the first electrodes 30. In an example, when the first electrodes 30 are reflective electrodes, the second electrode 60 may be a transparent or semi-transparent electrode. When the first electrodes 30 are transparent or semi-transparent electrodes, the second electrode 60 may be a reflective electrode.

Figure 13:
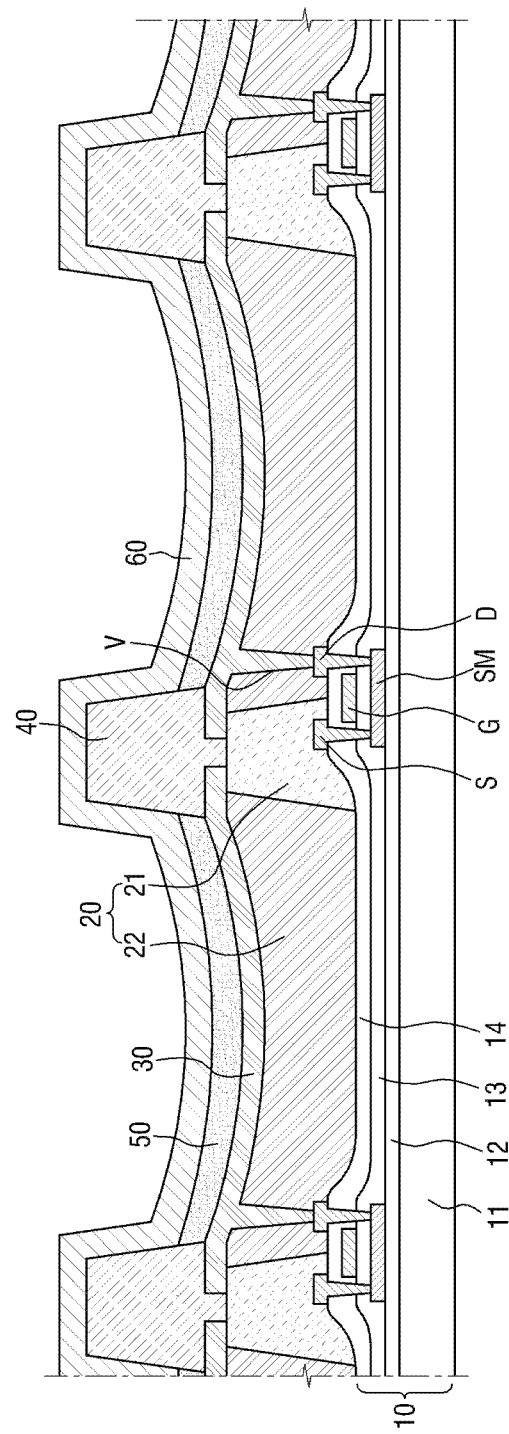
FIG. 13 is a cross-sectional view of an organic light-emitting display device according to another embodiment of the present invention.

Another embodiment of the present invention will now be described with reference to FIG. 13. FIG. 13 is a cross-sectional view of an organic light-emitting display device according to another embodiment of the present invention. Referring to FIG. 13, a top surface of a second planarization portion 22 may have a concave curved shape. A plurality of first electrodes 30, an organic light-emitting layer 50 and a second electrode 60 may also be formed in a concave curved shape corresponding to the shape of the second planarization portion 22. Because the top surface of the second planarization portion 22 has a concave curved shape, the amount of the organic light-emitting layer 50 included in one pixel may be increased as compared with the amount of the organic light-emitting layer 50 included in one pixel of the organic light-emitting display device of FIG. 12. Accordingly, the life of the organic light-emitting display device can be extended. In addition, the organic light-emitting layer 50 may be made to emit light at various angles, thus improving a viewing angle of the organic light-emitting display device. In the forming of the second planarization portion (operation S22) described above with reference to FIG. 8, a material for forming the second planarization portion is injected into each pixel in order to form the second planarization portion 22. Here, when the amount of the injected material is smaller than that of the material used for forming the second planarization portion illustrated in FIG. 8, the second planarization portion 22 may be shaped as shown in FIG. 13 due to surface tension between the second planarization portion 22 and a first planarization portion 21. In embodiments of the present invention, since the shape of the top surface of each second planarization portion 22 can be controlled for each pixel, the second planarization portions 22 in all pixels may be formed to have a concavely curved top surface. All other aspects of the method of manufacturing an organic light-emitting display device illustrated in FIG. 13 are substantially the same as those of the method of manufacturing an organic light-emitting display device described above with reference to FIGS. 1 through 12.

Another embodiment of the present invention will now be described with reference to FIG. 14. FIG. 14 is a cross-sectional view of an organic light-emitting display device according to another embodiment of the present invention. Referring to FIG. 14, a top surface of a second planarization portion 22 may have a convex curved shape. A plurality of first electrodes 30, an organic light-emitting layer 50 and a second electrode 60 may also be formed in a convex curved shape corresponding to the shape of the second planarization portion 22. Because the top surface of the second planarization portion 22 has a convex curved shape, the amount of the organic light-emitting layer 50 included in one pixel may be increased as compared with the amount of the organic light-emitting layer 50 included in one pixel of the organic light-emitting display device of FIG. 12. Accordingly, the life of the organic light-emitting display device can be extended. In addition, the organic light-emitting layer 50 may be made to emit light at various angles, thus improving a viewing angle of the organic light-emitting display device. In the forming of the second planarization portion (operation S22) described above with reference to FIG. 8, a material for forming the second planarization portion is injected into each pixel in order to form the second planarization portion 22. Here, when the amount of the injected material is greater than that of the material used for forming the second planarization portion illustrated in FIG. 8, the second planarization portion 22 may be shaped as shown in FIG. 14 due to surface tension between the second planarization portion 22 and a first planarization portion 21. In embodiments of the present invention, since the shape of the top surface of each second planarization portion 22 can be controlled for each pixel, the second planarization portions 22 in all pixels may be formed to have a convexly curved top surface. All other aspects of the method of manufacturing an organic light-emitting display device illustrated in FIG. 14 are substantially the same as those of the method of manufacturing an organic light-emitting display device described above with reference to FIGS. 1 through 12.

Embodiments of the present invention provide at least one of the following advantages.

That is, a top surface of a planarization layer can be made flat and even while the planarization layer is kept thin.

In addition, a thickness of an organic light-emitting display device can be reduced without deteriorating display quality of the organic light-emitting display device.

However, the effects of the present invention are not restricted to the one set forth herein. The above and other effects of the present invention will become more apparent to one of daily skill in the art to which the present invention pertains by referencing the claims.

What is claimed is:

1. An organic light-emitting display device comprising:
   a substrate comprising thin film transistors (TFTs);
   a planarization layer formed over the substrate and comprising a first planarization portion and a plurality of second planarization portions, the first planarization portion comprising a first top surface, each second planarization portion comprising a second top surface and a circumference;
   a plurality of first electrodes disposed over the planarization layer;
   an organic light-emitting layer disposed over each of the first electrodes; and
   a second electrode disposed over the organic light-emitting layer,
   wherein the first planarization portion surrounds each of the second planarization portions when viewed in a direction perpendicular to a major surface of the substrate and contacts the circumference of each of the second planarization portions, wherein the first top surface and the second top surface are laterally abutting with each other to provide a leveled surface that the plurality of the first electrodes contact.

2. The display device of claim 1, further comprising a pixel defining layer disposed over the planarization layer and surrounding the organic light-emitting layer when viewed in the direction.

3. The display device of claim 1, wherein one of the second planarization portions overlaps a corresponding one of the first electrodes and the organic light-emitting layer formed over the corresponding first electrode.

4. The display device of claim 3, wherein a gap between two immediately neighboring first electrodes is disposed on the first planarization portion.

5. The display device of claim 1, wherein one of the second planarization portions overlaps a corresponding one of the first electrodes and completely covers the organic light-emitting layer formed over the corresponding first electrode when viewed in the direction.

6. The display device of claim 1, wherein the second top surface of at least one of the second planarization portions has a substantially concave curved shape.

7. The display device of claim 1, wherein the second top surface of at least one of the second planarization portions has a substantially convex curved shape.

8. The display device of claim 1, wherein each of the first electrodes contacts both the first planarization portion and a corresponding one of the second planarization portions.

9. The display device of claim 1, wherein each of the first electrodes is connected to a corresponding one of the TFTs through a via hole formed through a corresponding one of the second planarization portions.

10. The display device of claim 1, wherein the first planarization portion comprises a portion that does not overlap the plurality of second planarization portions when viewed in the direction.

\* \* \* \* \*